United States Patent [19]

Smith et al.

[11] 3,743,842

[45] July 3, 1973

[54] SOFT X-RAY LITHOGRAPHIC APPARATUS AND PROCESS

[75] Inventors: Henry Ignatius Smith, Sudbury; David Lewis Spears, Acton; Ernest Stern, Concord, all of Mass.

[73] Assignee: Massachusetts Institute of Technology, Cambridge, Mass.

[22] Filed: Jan. 14, 1972

[21] Appl. No.: 217,902

[52] U.S. Cl. .................................. 250/320, 96/36.2
[51] Int. Cl. ........................................... G01n 21/34
[58] Field of Search ............................ 250/65 R, 90; 96/38.4, 36.2

[56] References Cited

UNITED STATES PATENTS

| | | | |
|---|---|---|---|
| 3,447,924 | 6/1969 | Trzyna et al. | 250/65 R |
| 2,382,674 | 8/1945 | Staud | 250/65 R |
| 1,933,652 | 11/1933 | Boldingh | 250/65 R |
| 3,118,786 | 1/1964 | Katchman et al. | 250/65 R |
| 3,637,380 | 1/1972 | Hallman | 250/65 R |
| 3,518,083 | 6/1970 | Touchy | 96/36.2 |

*Primary Examiner*—James W. Lawrence
*Assistant Examiner*—Harold A. Dixon
*Attorney*—Arthur A. Smith, Jr., Joseph S. Iandiorio et al.

[57] ABSTRACT

A soft X-ray lithographic apparatus for replicating patterns having submicron line widths including a source of soft X-rays, a mask member having a soft X-ray transmitter layer and a soft X-ray absorber layer of submicron thickness whose absorption of soft X-rays produces a soft X-ray image of the pattern on the mask; and a reproduction member consisting of a substrate and a soft X-ray sensitive layer supported on said substrate, said sensitive layer being between said substrate and said mask for absorbing soft X-rays in the pattern created by the mask.

16 Claims, 7 Drawing Figures

Patented July 3, 1973 3,743,842

2 Sheets-Sheet 1

SOFT X-RAY LITHOGRAPHIC APPARATUS AND PROCESS

FIELD OF INVENTION

This invention relates to a soft X-ray lithographic technique for replicating patterns having submicron line widths.

BACKGROUND OF INVENTION

A conventional method of pattern reproduction employs a photolithographic process in which ultra-violet light is shone onto a photosensitive film through a mask containing the pattern. After exposure the film is subjected to a developer which removes either the exposed or unexposed areas of the film to recreate the mask pattern or its obverse. This technique has been widely used in the manufacture of microminiature electronic circuits and components because it is inexpensive and reliable and suitable for mass production. This technique has not worked well where the width of the smallest discrete element of the pattern is less than about two microns. This is due to the fact that intimate mask-substrate contact is required in order to avoid diffraction effects. Such contact is difficult to obtain and damages both mask and substrate. Below about 1 micron photolithographic contact printing is not practical. Efforts to overcome this limitation by using light of shorter wavelength were not deemed practical because radiation of shorter wavelength, the so-called vacuum ultra-violet, can not be generated with adequate intensity. This apparent dead end turned the search for higher resolution replication techniques in other directions. For example, an electron image tube can be used for contactless replication. However the resolution improvement over photolithography is slight. Submicron resolution lithography is readily achieved with the scanning electron microscope but this method is not a replication process; the equipment is complex and expensive and each pattern must be traced out independently in accordance with directions from an automatic external programming device.

SUMMARY OF INVENTION

It is therefore an object of this invention to provide an improved pattern replication technique capable of submicron resolution.

It is a further object of this invention to provide such a technique which is inexpensive, simple, highly accurate and reliable.

It is a further object of this invention to provide such a technique which permits sufficient spacing between mask and reproduction member to prevent wear to the mask and damage to the reproduction member.

It is further object of this invention to provide such a technique which may be performed in normal environments without the necessity for vacuum chambers or photographic darkrooms.

The invention features a soft X-ray lithographic apparatus capable of replicating patterns having submicron line widths. There is a soft X-ray source and a mask member having a soft X-ray transmitter layer and soft X-ray absorber layer whose absorption of soft X-rays produces a soft X-ray image of the pattern on the mask. A reproduction member has a soft X-ray sensitive layer supported on a substrate. The sensitive layer is disposed between the substrate and the mask for absorbing soft X-rays in accordance with the pattern created by the mask.

DISCLOSURE OF PREFERRED EMBODIMENT

Other objects, features and advantages will occur from the following description of a preferred embodiment and the accompanying drawings, in which.

Figure 1:
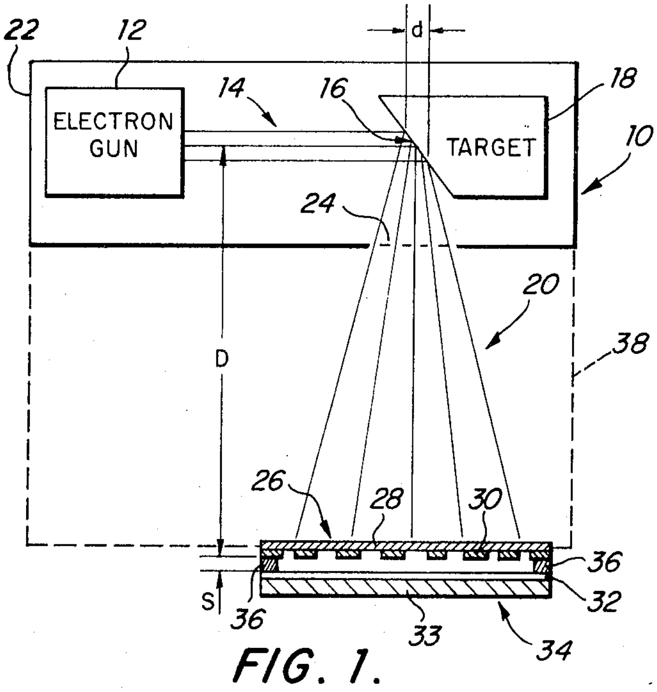
FIG. 1 is a diagram of a soft x-ray lithographic device according to this invention.

The invention may be accomplished with an arrangement, FIG. 1, including a source of soft X-rays 10 including an electron gun 12 for creating an electron beam 14 which impinges on a spot 16 on target 18. Soft X-rays 20 emitted by target 18 exit from enclosure 22 via a window 24 which is transparent to the soft X-rays 20. Soft X-rays 20 encounter mask 26 including a transmitter layer 28 which supports an absorber layer 30 which is used to define the mask pattern. The soft X-ray image formed by mask 26 is projected onto the sensitive layer 32 carried by substrate 33 of reproduction member 34 which supports mask 26 in spaced relation thereto by means of spacer layer 36 which is a part of mask 26. To improve the efficiency of the device, window 24 may be removed to decrease the attenuation of soft X-rays 20 but then a vacuum chamber 38 must be used. If the transmitter layer 28 of mask 26 is very thin a lesser vacuum may have to be applied on the other side of mask 26 to prevent buckling or warping thereof.

Beam 14 forms spot 16 having a diameter d typically with an area of 1 square millimeter, which with an electron current of approximately 5 amperes per square centimeter at 5 kilovolts results in a 50 milliampere current. With these conditions, an aluminum target and a distance D of 1 inch between beam 14 and mask 26 approximately ten minutes is required to adequately expose a sensitive layer 32 of polymethyl-methacrylate supported on a silicon substrate 33.

Mask 26 consists of a 5 micron thick transmitter layer 28 of silicon and a 0.5 micron thick absorber layer 30 of gold. A five micron thickness of transmitter layer 28 is chosen because it is a self supporting structure and the ½ micron thickness of the absorber layer 30 is chosen to achieve the required contrast. A thicker absorber layer 30 could provide greater contrast, but a layer thickness much greater than the width of the slots and holes in the layer may result in rough, ill-defined side walls and consequent poor reproduction. Thus a layer which is not greater in thickness than the width of the smallest holes or slots is desirable and preferred and can be achieved through electron lithographic means.

Typically window 24 may be a one thousandths of an inch thick foil of beryllium. If the window is not used, a vacuum of $10^{-9}$ atmospheres in chamber 38 would be adequate but an additional vacuum of $10^{-2}$ atmospheres may be required on the other side of mask 26 to prevent its warping or bulging.

Target 18 may be made of aluminum to produce soft X-rays having a wavelength of 8.34 A. Alternatively, targets of copper producing soft X-rays at 13.4 A., or molybdenum producing soft X-rays at 5.4 A. may be used.

Figure 2:
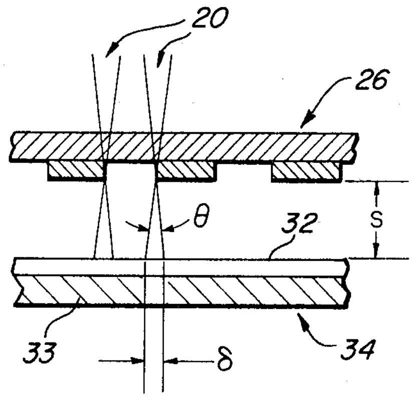
FIG. 2 is an enlarged cross-sectional view of a portion of the mask and reproduction member shown in FIG. 1.

An important advantage of using soft X-rays is that substantial separation between the mask and sensitive layer can be permitted. At the wavelengths of soft X-rays, diffraction effects are generally negligible. Penumbral distortion, illustrated in FIG. 2, is a factor in arranging mask 26 and member 34. The relationship between the distance *D*, diameter *d* of the spot 16, divergence angle $\theta$, spreading $\delta$ and spacing *S* provided by the spacer layer 36, may be expressed as $\theta = d/D$, $\delta$, $Sd/D$. Thus undercutting, or spreading, $\delta$, could be reduced by increasing *D*, but this greatly increases the exposure time because the soft X-ray intensity varies as the inverse square of *D*.

The achievement with this soft X-ray process of the capability for separating the mask and sensitive layer is a significant contribution because it eliminates wear to the mask and damage to the substrate resulting from the contact method used previously; increased mask life is thereby achieved. Practically, the spacing may be as much as ten times the minimum line width of the pattern without causing serious undercutting in the sensitive layer 32.

All previous efforts to overcome the depth of field limitation of conventional photolithography were directed towards schemes involving the use of electrons as the exposing radiation. Soft X-rays which constitute the exposing radiation described in the process and apparatus of this invention are between the vacuum ultraviolet (100 – 1000 A.) and common X-ray (0.5 – 2 A.) radiation bands of the electromagnetic spectrum. The common X-ray band has been the subject of extensive scientific investigation and commercial application during the last several decades. In marked contrast to this, soft X-rays which are strongly absorbed by the exit window of all common X-ray tubes have been subject to relatively little scientific study. The feasibility of using soft X-rays for replicating sub-micron line width patterns has followed on the successful development in recent years of thin film deposition technology. The development of this technology caused the inventors to become interested in investigating the soft X-ray approach to replication and to depart from the path of those who seek to improve the established but more complex and expensive electron projection technology alluded to earlier.

Figure 3:
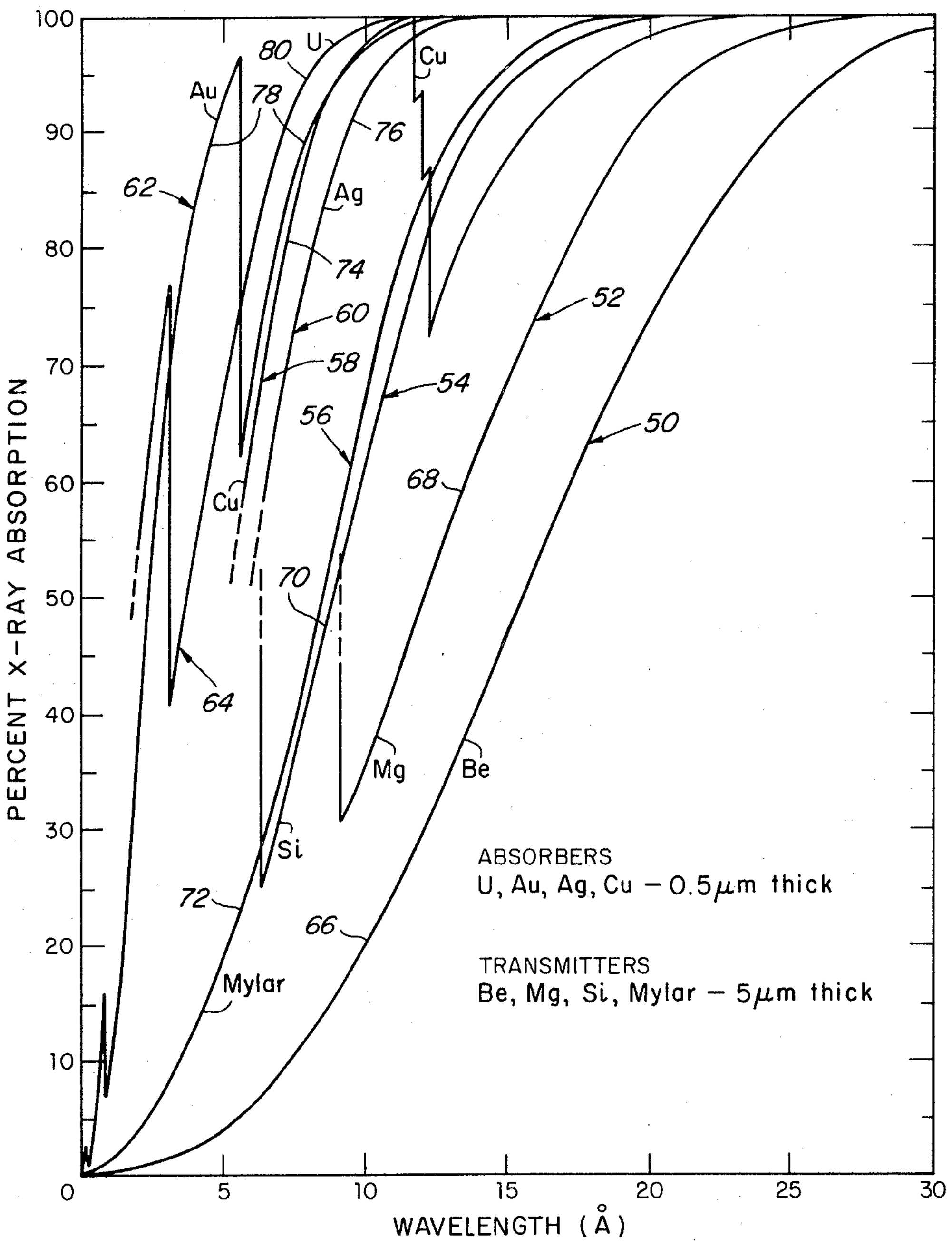
FIG. 3 shows a group of characteristic curves of wavelength versus absorption.

The variations in absorption coefficient from material to material in the soft X-ray region is not large. However, there are materials sufficiently distinguishable as absorbers and transmitters for soft X-ray radiation. Typical absorption characteristics, FIG. 3, are shown in the soft X-ray range from two or three Angstroms to 20 or 25 Angstroms for transmitters of 5 micron thickness such as beryllium 50, magnesium 52, silicon 54, and Mylar 56, and for absorbers of ½ micron thickness such as copper 58, silver 60, gold 62 and uranium 64. Beryllium 50, magnesium 52, silicon 54, and Mylar 56 in portions 66, 68, 70 and 72 of their respective curves are sufficiently transparent to make them excellent choices for the transmitter layer. Also copper 58, silver 60, gold 62 and uranium 64 in portions 74, 76, 78, and 80 of their respective curves approach absorption maxima. At approximately 10–12 A. copper, gold, uranium and silver are over 95 percent absorptive, whereas magnesium is about 40 percent and beryllium about 25 percent absorptive giving a contrast of approximately 20 to 1, with over 60 percent transmission through the transmitter layer 28. At 8 A. gold, uranium, and copper are about 90 percent absorptive giving a contrast of 10 to 1, whereas Mylar, and silicon are only about 40 percent absorptive. Platinum and iridium have characteristics nearly identical with that of gold except for a slight change in the position of the sharp vertical peak at 5.6 A. for gold. Similarly aluminum and polymer films serve as good transmitters.

Figure 4:
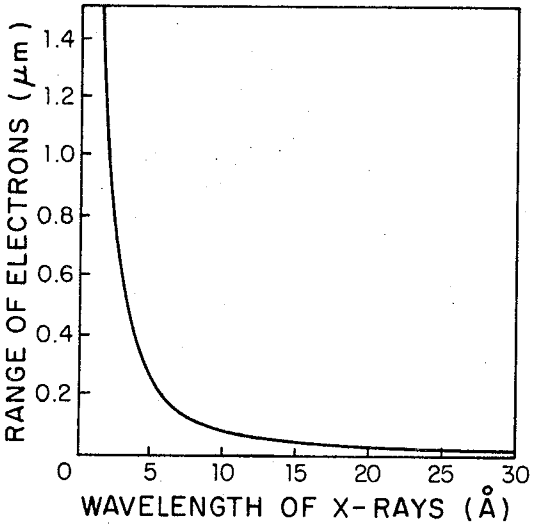
FIG. 4 shows a characteristic curve of Auger and photoelectron range versus wavelength.

Another advantage of using soft X-rays is that, the range of the Auger and photoelectrons produced by the soft X-rays in the sensitive layer 32, is quite short—0.5 microns or less as shown in FIG. 4. Since these electrons serve to expose the sensitive layer 32 the effect of their range on the resolution of the process is minimized by using soft X-rays.

Figure 5:
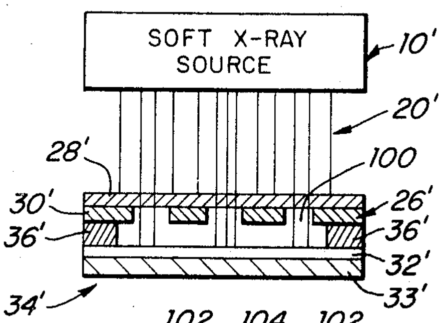
FIG. 5 is a diagram of a first step in a soft X-ray lithographic process according to this invention.
Figure 6:
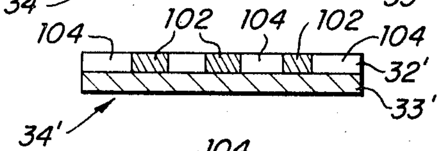
FIG. 6 is a diagram similar to that of FIG. 5 showing the reproduction member after exposure.
Figure 7:
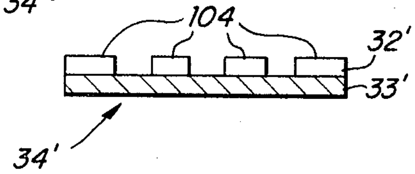
FIG. 7 is a diagram similar to that of FIGS. 5 and 6 showing the reproduction member after developing.

In operation, a soft X-ray source 10′, FIG. 5, irradiates a sensitive layer 32′ of polymethyl methacrylate through a mask 26′ including a 5 micron thick transmitter layer 28′ of silicon patterned with a ½ micron absorber layer 30′ of gold and a spacer layer 36′. Sensitive layer 32 is carried on a substrate 33′ such as a silicon wafer. Soft X-rays 20′ pass through slots or holes 100 in absorber layer 30′ and strike portions 102 of sensitive layer 32′ which thereby become exposed as shown in FIG. 6. The nonstruck portions 104 are unexposed. An energy dose of about $5 \times 10^{+2}$ joules per centimeter cubed is sufficient to fully expose the pattern. In the next step, FIG. 7, when reproduction member 34′ is developed using a solution of 40 percent methyl isobutyl ketone and 60 percent isopropyl alcohol, the exposed portions 102 are removed and leave a patterned surface the same as that carried by the mask 26′.

Once a pattern is defined in the polymer film, there are a number of methods to produce a pattern on the substrate. If an overlayer pattern of a thin film material is desired, it can be evaporated by standard techniques into the interstices of the polymer pattern and the unwanted material removed by dissolving the polymer, thus yielding the thin film on the substrate surface in a pattern obverse to that created in the polymer. Alternatively, this deposited material may be used as a mask for either the chemical or sputter etching of a relief structure in the substrate. Also, the patterned polymer may be similarly used as a chemical or sputter etching mask.

Other embodiments will occur to those skilled in the art and are within the following claims:

What is claimed is:

1. A soft X-ray lithographic apparatus capable of replicating patterns having submicron line widths comprising: a source of soft X-rays having a diameter *d;* a mask member spaced from said source by a distance *D* where the ratio of *D/d* is greater than 5, said mask member having a soft X-ray transmitter layer more than 2½ microns thick and a soft X-ray absorber layer more than one quarter of a micron thick whose absorption of soft X-rays produces a soft X-ray image of the pattern on the mask; and a reproduction member including a substrate and a soft X-ray sensitive layer between said substrate and said mask, and spaced from said mask by a distance less than 30 microns, for absorbing the soft X-rays in the pattern created by the mask.

2. The apparatus of claim 1 in which said source of soft X-rays includes an aluminum target.

3. The apparatus of claim 1 in which said transmitter layer is silicon.

4. The apparatus of claim 1 in which said absorber is gold.

5. The apparatus of claim 1 in which said soft X-ray source produces radiation of from two to twenty Angstroms wavelength.

6. The apparatus of claim 1 in which said transmitter layer is at least 5 microns thick and said absorber layer is less than ½ micron thick.

7. The apparatus of claim 1 in which said sensitive layer is polymethyl methacrylate.

8. The apparatus of claim 1 in which said absorber layer absorbs at least 60 percent of the soft X-rays.

9. The apparatus of claim 1 in which said transmitter layer transmits at least 25 percent of the soft X-rays.

10. A soft X-ray lithographic process capable of replicating patterns having submicron line widths comprising: generating soft X-rays at a source having a diameter *d*, directing those soft X-rays through a mask spaced from the source by a distance *D* where the ratio *D/d* is greater than 5, said mask having a transmitter layer more than 2½ microns thick and an absorber layer more than one quarter of a micron thick to produce a soft X-ray image of the pattern on the mask; exposing to that image a reproduction member including a substrate and a soft X-ray sensitive layer between said substrate and said mask, and spaced from said mask by a distance less than 30 microns, so that a portion of the sensitive layer corresponding to the absorber portions of the mask are less exposed than the other portions; and subjecting said soft X-ray sensitive layer to a developer to remove said portions from said sensitive layer to reproduce the pattern of said mask.

11. The process of claim 10 in which said soft X-rays are between 2 and 20 Angstroms in wavelength.

12. The process of claim 10 in which said transmitter layer is at least five microns thick and said absorber layer is less than ½ micron thick.

13. The process of claim 10 in which said transmitter layer is silicon.

14. The process of claim 10 in which said absorber layer is gold.

15. The process of claim 10 in which said sensitive layer is polymethyl methacrylate.

16. The process of claim 10 in which said developer is 40 percent methyl isobutyl ketone and 60 percent isopropyl alcohol.

* * * * *

UNITED STATES PATENT OFFICE

CERTIFICATE OF CORRECTION

Patent No. 3,743,842 Dated July 3, 1973

Inventor(s) Henry Ignatius Smith, David Lewis Spears and Ernest Stern

It is certified that error appears in the above-identified patent and that said Letters Patent are hereby corrected as shown below:

Column 3, line 18

Delete " , " third occurrence, substitute =

Column 6, line 11

After " remove ", insert --one of--

Signed and Sealed this

*thirtieth* Day of *March 1976*

[SEAL]

*Attest:*

RUTH C. MASON
*Attesting Officer*

C. MARSHALL DANN
*Commissioner of Patents and Trademarks*